(12) United States Patent
Onodera et al.

(10) Patent No.: US 9,129,075 B2
(45) Date of Patent: Sep. 8, 2015

(54) MESH GENERATION SYSTEM

(71) Applicant: HITACHI, LTD., Tokyo (JP)

(72) Inventors: Makoto Onodera, Hitachinaka (JP);
Ichiro Nishigaki, Ishioka (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 13/716,286

(22) Filed: Dec. 17, 2012

(65) Prior Publication Data

US 2013/0226530 A1    Aug. 29, 2013

(30) Foreign Application Priority Data

Feb. 28, 2012 (JP) ................................. 2012-040856

(51) Int. Cl.
*G06F 17/50* (2006.01)
*G06T 17/20* (2006.01)

(52) U.S. Cl.
CPC ............... *G06F 17/50* (2013.01); *G06T 17/20* (2013.01)

(58) Field of Classification Search
None
See application file for complete search history.

(56) References Cited

U.S. PATENT DOCUMENTS

| 6,727,898 B2 * | 4/2004 | Hariya et al. ................. 345/420 |
| 6,907,307 B2 * | 6/2005 | Chen et al. .................... 700/119 |
| 7,739,083 B2 * | 6/2010 | Naono et al. ...................... 703/2 |

FOREIGN PATENT DOCUMENTS

| JP | 06-259404 A  | 9/1994 |
| JP | 11-025292 A  | 1/1999 |
| JP | 2005-018403 A | 1/2005 |
| JP | 2006-004259 A | 1/2006 |

* cited by examiner

*Primary Examiner* — Omar Fernandez Rivas
*Assistant Examiner* — Herng-Der Day
(74) *Attorney, Agent, or Firm* — Mattingly & Malur, PC (57) ABSTRACT

Generation of a mesh model that can be analyzed with sufficient analysis accuracy for result evaluation and within a minimum possible calculation time even if a user does not grasp a tradeoff relation between analysis accuracy and analysis time due to mesh size is made possible. A mesh generation system designates an evaluation point (site) on an analysis target shape, analyzes plural analysis model data created with plural types of mesh size, stores a relation among mesh size, analysis result and calculation time in a mesh know-how DB, search for a mesh size which meets a required accuracy and calculation time limit, sets the mesh size that is found by the search to an analysis model. And displays the relation among mesh size, analysis result and calculation time.

4 Claims, 12 Drawing Sheets

EXAMPLE OF CONFIGURATION OF PRESENT MESH SYSTEM

FIG. 1

EXAMPLE OF CONFIGURATION OF PRESENT MESH SYSTEM

FIG. 2

EXAMPLE OF EVALUATION POINT DESIGNATION SCREEN
OF EVALUATION POINT DESIGNATING UNIT 102

EXAMPLE OF PROCESSING PROCEDURES BY MULTIPLE-MESH GENERATING UNIT 103 AND ANALYSIS CALCULATION UNIT 104

FIG. 5

EXAMPLE OF DATA STRUCTURE OF MESH KNOW-HOW DB 105

501

| MESH SIZE | NUMBER OF ELEMENTS | NUMBER OF NODES | VALUE OF ANALYSIS RESULT AT EVALUATION POINT 1 | VALUE OF ANALYSIS RESULT AT EVALUATION POINT 2 | ... | CALCULATION TIME |
|---|---|---|---|---|---|---|
| | | | | | | |

502

| MESH SIZE | MESH SIZE AT SITE 1 | MESH SIZE AT SITE 2 | ... | NUMBER OF ELEMENTS | NUMBER OF NODES | VALUE OF ANALYSIS RESULT AT EVALUATION POINT 1 | VALUE OF ANALYSIS RESULT AT EVALUATION POINT 2 | ... | CALCULATION TIME |
|---|---|---|---|---|---|---|---|---|---|
| | | | | | | | | | |

FIG. 6

EXAMPLE OF REQUIRED ACCURACY/TIME LIMIT INPUT SCREEN OF REQUIRED ACCURACY/TIME LIMIT INPUT UNIT

FIG. 7

EXAMPLE OF MESH KNOW-HOW DISPLAY
SCREEN OF MESH KNOW-HOW DISPLAY UNIT 109

FIG. 8

EXAMPLE OF CALCULATION TIME AND ANALYSIS ACCURACY PREDICTION SCREEN

FIG. 9

EXAMPLE OF ANALYSIS ACCURACY DISTRIBUTION DISPLAY SCREEN

FIG. 10

EXAMPLE OF EXPERIMENTAL VALUE INPUT SCREEN AND MESH KNOW-HOW DISPLAY SCREEN

FIG. 11

EXAMPLE OF EXPERIMENTAL VALUE INPUT SCREEN AND MESH KNOW-HOW DISPLAY SCREEN

| MESH SIZE (mm) | NUMBER OF ELEMENTS | NUMBER OF NODES | VALUE OF ANALYSIS RESULT AT EVALUATION POINT | CALCULATION TIME |
|---|---|---|---|---|
| 25 | 972 | 1950 | 2.5143 | 0.5 |
| 20 | 1168 | 2496 | 2.5255 | 0.8 |
| 15 | 1722 | 3007 | 2.5352 | 1.1 |
| 10 | 3087 | 5622 | 2.5541 | 3.8 |
| 8 | 3523 | 6782 | 2.5557 | 5.6 |
| 6 | 6227 | 11319 | 2.5611 | 15.1 |
| 4 | 15101 | 25408 | 2.5662 | 78.1 |
| 3 | 23692 | 39469 | 2.5676 | 188.5 |
| 2.5 | 35813 | 55681 | 2.5695 | 375.1 |
| 2 | 43271 | 68861 | 2.5712 | 573.7 |

FIG. 12

EXAMPLES OF MESH THAT CAN BE CREATED

FIG. 13

EXAMPLE OF MESH KNOW-HOW DISPLAY SCREEN

MESH GENERATION SYSTEM

FIELD OF THE INVENTION

The present invention relates to a CAE (computer aided engineering) system which numerically simulates a physical phenomenon based on numeric analysis using a computer, and particularly to generation of a mesh in CAE.

BACKGROUND ART

In product development processes, CAE is utilized to reduce development costs and shorten design and development periods. In CAE, an analysis model is created from a shape model or the like generated on a CAD (computer aided design) system, and strength analysis, thermal analysis, vibration analysis or the like is carried out using an analysis method, for example, the finite element method or the boundary element method, with that analysis model. In the generation of an analysis model in CAE as described above, first, the work of creating a mesh model from a shape model and setting boundary conditions or the like on each element of the mesh model is required, and a lot of time and effort is needed particularly to create a mesh model. This is because, in an analysis method such as the finite element method, a solution changes depending on the size of the mesh (mesh size) and the user needs to find out an appropriate mesh size based on trial and error. Generally, analysis accuracy is improved as the mesh size is reduced. Meanwhile, as the mesh size decreases, computation scale increases and therefore analysis time increases. That is, analysis accuracy and analysis time are in a tradeoff relation.

A designer or person in charge of the analysis who is skilled in analysis intuitively grasps this tradeoff relation based on experience and therefore depends on empirical values though the person can decide an appropriate mesh size after some trials and errors. On the other hand, a beginner of analysis needs many trials and errors in order to decide an appropriate mesh size. Moreover, it is possible not only to set a uniform mesh size for an analysis target model but also to provide partly different mesh sizes (controlled mesh size density). Deciding an appropriate mesh size in consideration of this controlled mesh size density is not easy even to a person skilled in analysis.

In view of such backgrounds, techniques to reduce the burden of mesh creation are proposed.

JP-A-2005-018403 discloses a technique in which the degree of an element with a large error (low analysis accuracy) in a computation process is raised with respect to a created mesh, thus minimizing the error (improving analysis accuracy) (this method is called adaptive p-method).

JP-A-11-25292 discloses a technique in which a regular and fine mesh is generated in a portion designated as an evaluation part, thus creating a mesh with high quality, that is, a mesh with high analysis accuracy.

JP-A-6-259404 discloses a technique in which an error in an analysis result is evaluated, an element with an error equal to or greater than a reference value and peripheral elements thereof are deleted, and the resulting space is filled with a dense element. This process is repeated until the error is reduced to the reference value or below. Thus, a mesh with accuracy guaranteed is created.

JP-A-2006-4259 discloses a technique in which the relation between computer performance and analysis time and the relation between the number of divisions (mesh size) and analysis accuracy are stored in advance and analysis time and analysis accuracy are predicted based on these relations.

As described above, CAE has the problem that the burden of mesh creation needs to be reduced. To solve this problem, in the techniques of JP-A-2005-018403 and JP-A-6-259404, a mesh with high analysis accuracy is created by adjusting the degree of an element or the mesh size and thus minimizing an error. Therefore, the mesh size adjustment work through trial and error by the user is no longer necessary. However, in these techniques, since repetition of arithmetic operations to adjust the degree of an element or the mesh size takes place, there is a problem that the analysis calculation time per analysis is long. Generally, if a mesh that can be analyzed with accuracy equivalent to an analysis result by the p-method is created and normal analysis calculation is carried out, this analysis takes a calculation time approximately five times longer than in the p-method. When an analysis is carried out once to several times as in analysis to confirm a phenomenon, this approximately five times longer calculation time is significantly shorter than the time for trial and error of mesh size and is therefore practical. However, when an analysis is carried out tens to hundreds of times in order to find out design sensitivity or for optimized calculation or the like, there is a problem that the approximately five times longer calculation time is longer than the time for trial and error of mesh size.

In the technique of JP-A-11-25292, a regular and fine mesh is generated in a portion designated as an evaluation part, thus creating a mesh with high quality, that is, a mesh with high analysis accuracy. However, this technique only creates a mesh with relatively high analysis accuracy. Therefore, there is a problem that the technique does not create a mesh with sufficient accuracy guaranteed.

In the technique of JP-A-6-259404, as in the technique of JP-A-2005-018403, repetition of arithmetic operations takes place, prolonging the analysis calculation time. Therefore, when an analysis is carried out tens to hundreds of times, there is a problem that the calculation time needs to be shortened.

The technique of JP-A-2006-4259 has a problem that the user needs to prepare a mesh with accuracy guaranteed in advance.

SUMMARY OF THE INVENTION

In view of the foregoing, an object of the invention is to provide a mesh generation system capable of generating a mesh model that can be analyzed with sufficient analysis accuracy for result evaluation and within a minimum possible calculation time, even if the user does not grasp the tradeoff relation between analysis accuracy and analysis time due to mesh size.

To solve the foregoing problems, for example, the following configuration can be employed.

The present application includes plural measures to solve the problems. As an example of such measures, a mesh generation system includes: a mesh know-how DB generating unit having an evaluation point designating unit which designates an evaluation point or an evaluation site on an analysis target shape, a multiple-mesh generating unit which generates meshes of plural mesh sizes with respect to the analysis target shape, and an analysis calculation unit which analyzes plural analysis model data created with the plural types of mesh size, the mesh know-how DB generating unit generating a relation among mesh size, analysis result and calculation time to be stored in a mesh know-how DB; a mesh know-how DB which stores the relation among mesh size, analysis result and calculation time; an input unit which inputs a required accuracy or calculation time limit; a mesh size search unit which searches for a mesh size that meets the required accuracy or calculation time limit, based on the relation among mesh size, analysis result and calculation time registered in the mesh know-how DB; an analysis model setting unit which sets the mesh size found by the search, to an analysis model; and a display unit which reads the relation among mesh size, analysis result and calculation time from the mesh know-how DB and displays the relation among mesh size, analysis result and calculation time.

According to the invention, a mesh generation system capable of generating a mesh model that can be analyzed with sufficient analysis accuracy for result evaluation and within a minimum possible calculation time, even if the user does not grasp the tradeoff relation between analysis accuracy and analysis time due to mesh size, can be provided. Therefore, the burden of mesh creation can be reduced.

Other problems, configuration and advantages than those described above will be made clear in the following description of embodiments.

DESCRIPTION OF THE PREFERRED EMBODIMENTS

Hereinafter, embodiments of a mesh generation system according to the invention will be described with reference to the drawings.

Embodiment 1

Example of Configuration of Mesh Generation System

Figure 1:
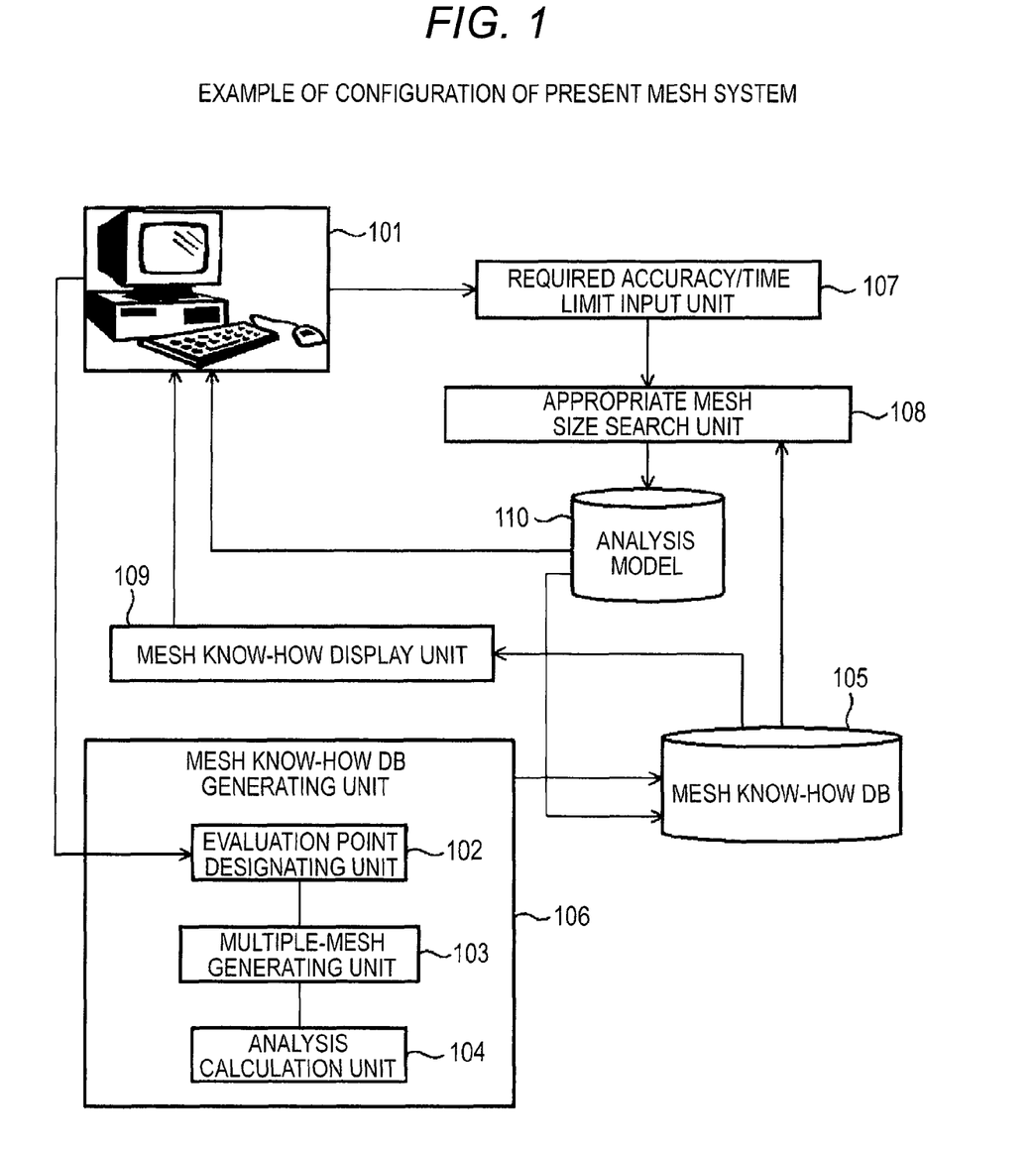
FIG. 1 shows an example of the configuration of the present mesh system.

FIG. 1 shows the configuration of an embodiment of a mesh generation system according to the invention. The mesh generation system shown in FIG. 1 includes: an input/output device 101 having a keyboard, pointing device, display or the like for a system user to input data or to have data displayed; and a mesh know-how DB generating unit 106 having an evaluation point designating unit 102 which has a measure to designate an evaluation point (site) on an analysis target shape, a multiple-mesh generating unit 103 which creates meshes of plural types of mesh size, and an analysis calculation unit 104 which carries out analysis calculation with respect to plural mesh models created by the multiple-mesh generating unit 103, the mesh know-how DB generating unit 106 registering, in a mesh know-how DB 105, a relation among mesh size, analysis result and calculation time ("time" is considered as "cost" and therefore can be considered as "calculation cost") based on results of the evaluation point designating unit 102 and the multiple-mesh generating unit 103. The mesh generation system also includes: a required accuracy/time limit input unit 107 which inputs a required accuracy or calculation time limit; an appropriate mesh size search unit 108 which searches for a mesh size that meets the required accuracy or calculation time limit, based on the relation among mesh size, analysis result and calculation time (cost) registered in the mesh know-how DB 105, and set the mesh size found by the search, to an analysis target model; an analysis model setting unit 110 which sets the mesh size found by the search, to an analysis model; and a mesh know-how display unit 109 which reads the relation among mesh size, analysis result and calculation time (cost) from the mesh know-how DB 105 and displays the relation among mesh size, analysis result and calculation time (cost).

Hereinafter, an example of processing procedures according to the invention will be described.

(1) Evaluation Point Designating Unit 102

Figure 2:
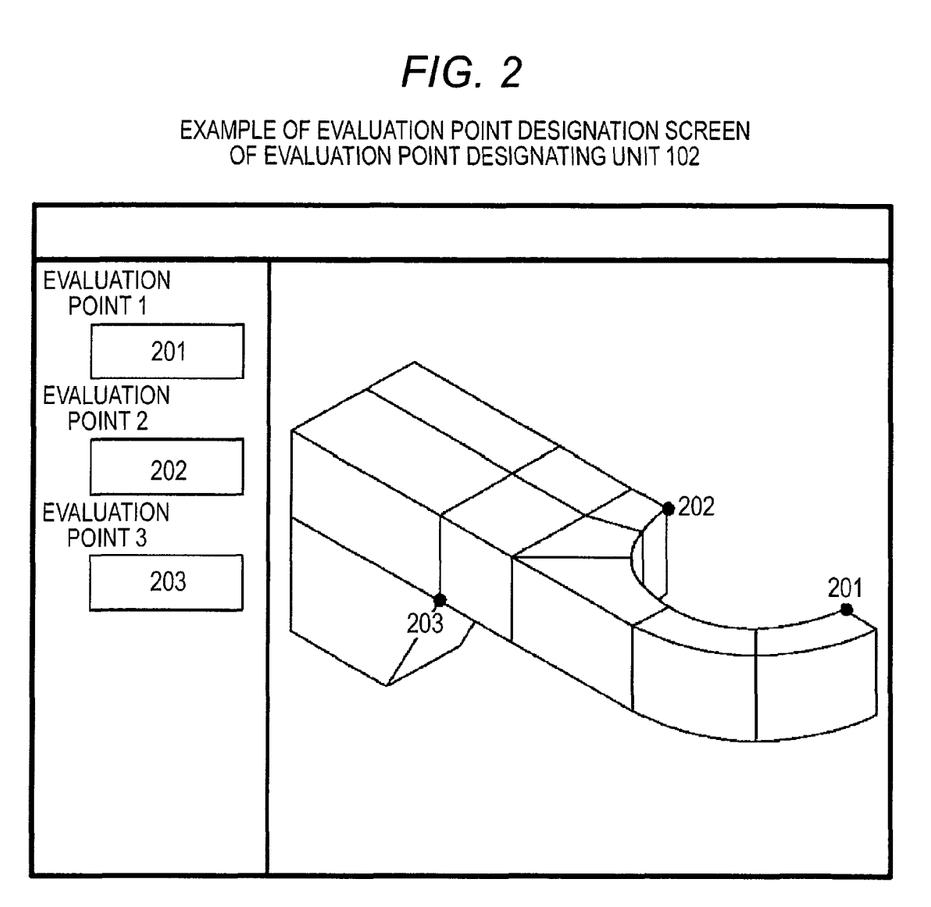
FIG. 2 shows an example of an evaluation point designation screen of an evaluation point designating unit.

FIG. 2 shows an example of an evaluation point designation screen. The system user using the mesh generation system selects and designates a site (an evaluation point 1 indicated by a reference numeral 201, an evaluation point 2 indicated by a reference numeral 202, an evaluation point 3 indicated by a reference numeral 203) on an analysis target shape where analysis accuracy is evaluated, using the input/output device 101. Plural sites can be designated for evaluation.

(2) Multiple-Mesh Generating Unit 103 and Analysis Calculation Unit 104

Figure 3:
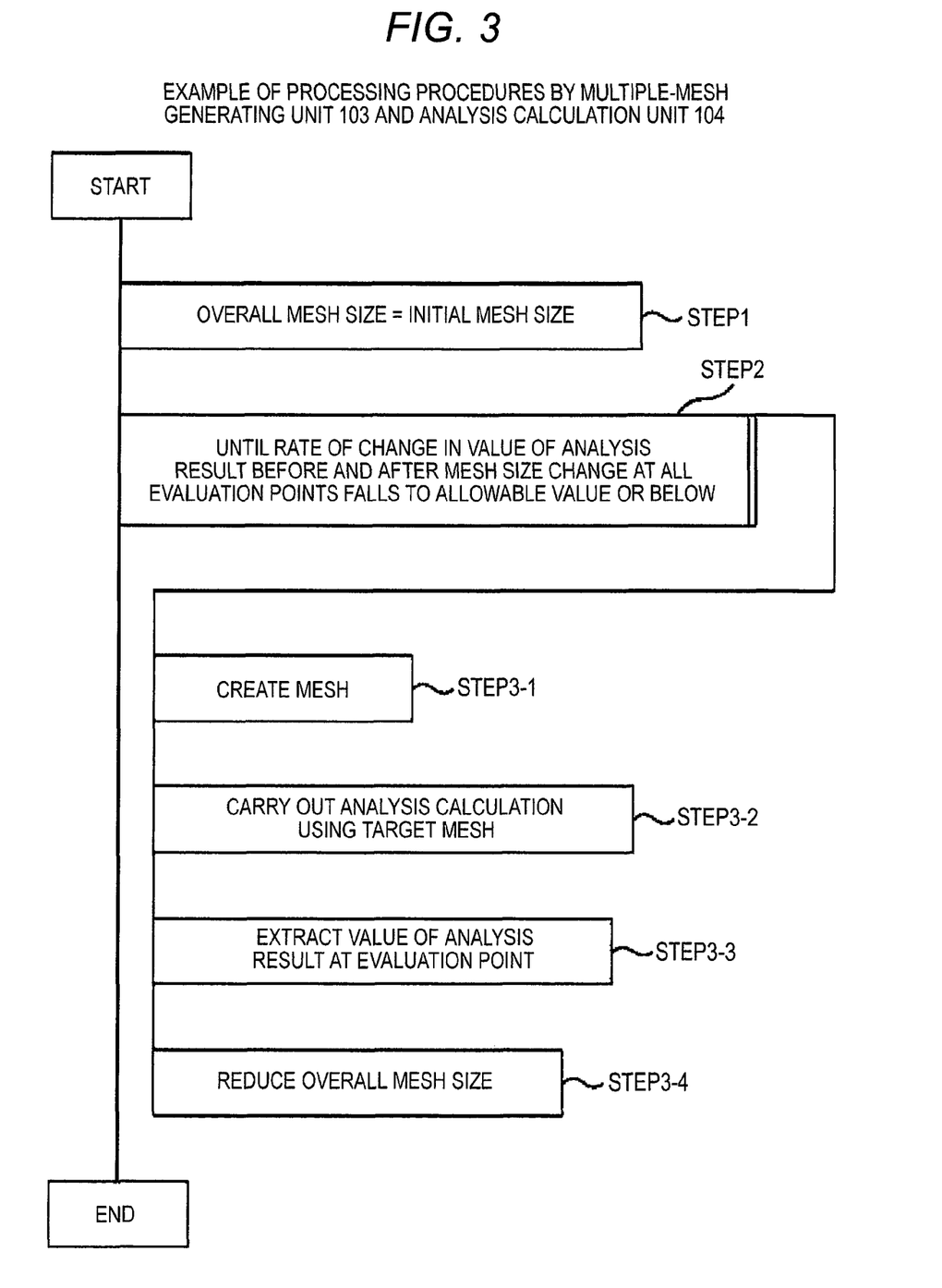
FIG. 3 shows an example of processing procedures by a multiple-mesh generating unit and an analysis calculation unit.

FIG. 3 is a PAD diagram showing an example of processing procedures by the multiple-mesh generating unit 103 and the analysis calculation unit 104.

In STEP 1, an overall mesh size for an analysis target shape is set as an initial mesh size.

First, a mesh is created in the initial mesh size on the analysis target shape (STEP 3-1). This initial mesh size may have an arbitrary value, which can be inputted by the operator or automatically decided based on the size of the analysis target shape. Next, analysis calculation is carried out using this mesh (STEP 3-2). The value of the analysis result at the site designated by the evaluation point designating unit 102 is extracted (STEP 3-3). The value of the analysis result varies depending on analysis type or the like and may be, for example, the amount of displacement or stress in the case of strength analysis, or a physical quantity to be analyzed such as temperature in the case of thermal analysis. Subsequently, the mesh size is changed to a smaller value (STEP 3-4) and the processing of STEPS 3-1 to 3-3 is carried out. These STEPS 3-1 to 3-4 are repeated until the rate of change in the value of the analysis result at the evaluation point before and after the change in mesh size falls to an allowable value or below (STEP 2).

This is based on a property that analysis accuracy improves as the mesh size is decreased, that is, when analysis accuracy becomes sufficient in terms of computational theory, the value of the analysis result does not change even if the mesh size is decreased.

The processing procedure shown in the PAD diagram of FIG. 3 is an example in the case where the mesh size is uniformly changed. However, the mesh size can be controlled to have sparse and dense portions.

Figure 4:
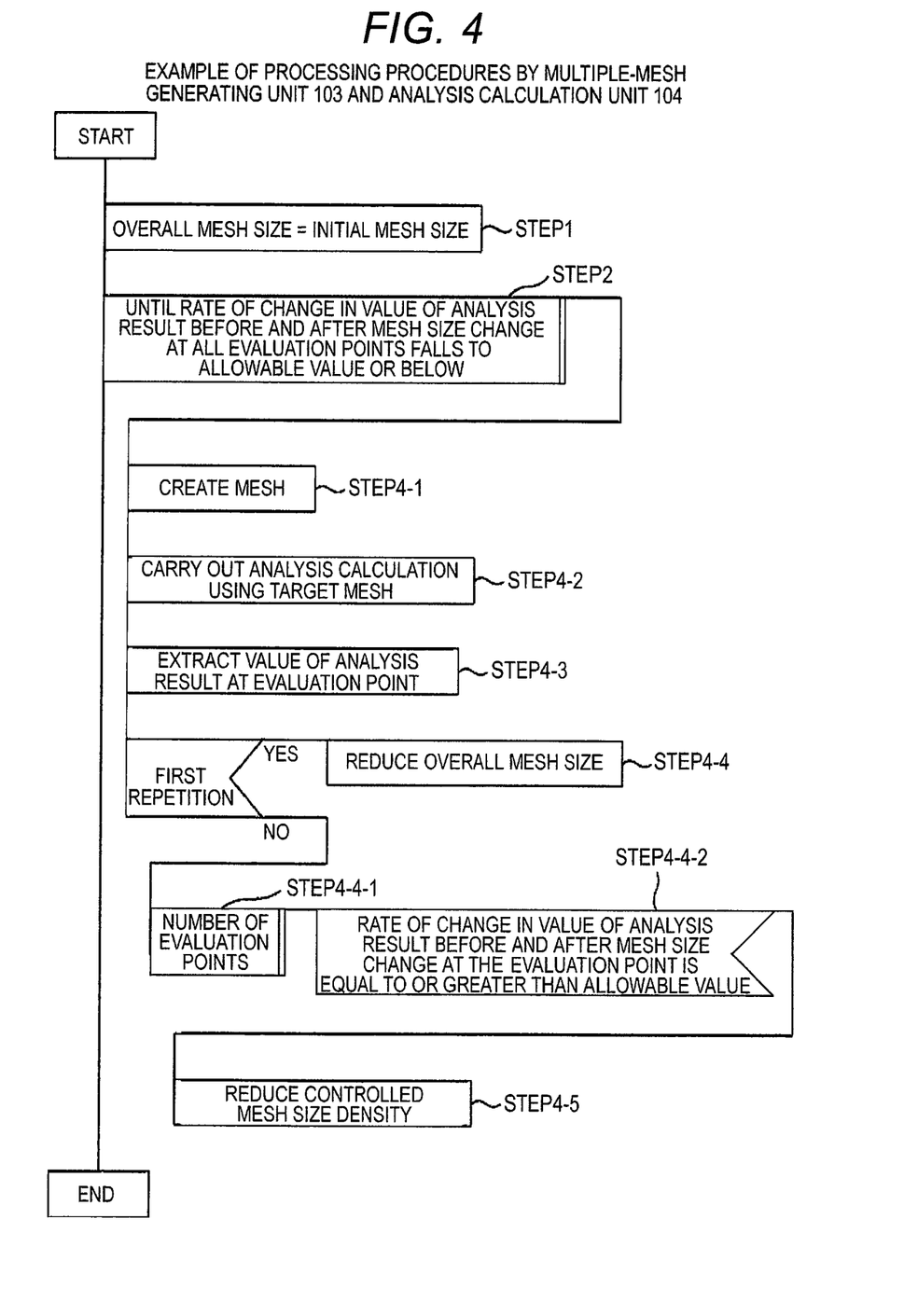
FIG. 4 shows an example of processing procedures by the multiple-mesh generating unit and the analysis calculation unit.

Next, the PAD diagram of FIG. 4 shows an example of processing procedures in the case where the mesh size is controlled to have sparse and dense portions. The processing of STEP 1 and STEP 2 is similar to FIG. 3.

First, a mesh is created in the initial mesh size on the analysis target shape (STEP 4-1). This initial mesh size is uniform (overall mesh size). Next, analysis calculation is carried out using this mesh (STEP 4-2) and the value of the analysis result at the site designated by the evaluation point designating unit 102 is extracted (STEP 4-3). Subsequently, the overall mesh size is changed to a smaller value (STEP 4-4) and the processing of STEPS 4-1 to 4-3 is carried out.

Here, if the rate of change in the value of the analysis result before and after the change in mesh size is determined as equal to or greater than an allowable value (STEP 4-4-2), the controlled mesh size density is changed to a smaller value only on the evaluation point that are thus determined (STEP 4-5). The process is repeated by the number of times of the evaluation points that are thus determined (STEP 4-4-1). The processing of STEPS 4-1 to 4-3 and STEP 4-5 is repeated until the rate of change in the value of the analysis result of the evaluation point before and after the change in mesh size falls to the allowable value or below (STEP 2).

In the procedure in this example, a controlled mesh size density is set only at the site designated as an evaluation point. However, a controlled mesh size density can also be set on other sties than evaluation points. For example, the rate of change in the value of the analysis result before and after the change in mesh size may be calculated with respect to all the nodes on the mesh and a controlled mesh size density may be set on nodes where the rate of change is equal to or greater than an allowable value.

Moreover, when the technique shown in the PAD diagram of FIG. 4 is employed, the processing procedures are slightly more complex than in the case of FIG. 3, but only the mesh at the evaluation site can be made denser while the mesh at non-evaluation sites remains sparse. Therefore, sufficient analysis accuracy can be achieved while the overall number of meshes can be kept small.

(3) Mesh Know-How DB Generating Unit 106

The information obtained by the evaluation point designating unit 102, the multiple-mesh generating unit 103 and the analysis calculation unit 104 is registered in the mesh know-how DB 105. An example of the data structure of the mesh know-how DB 105 is indicated by a reference numeral 501 in FIG. 5. In this manner, the mesh size, number of elements, number of nodes, value of analysis result at each evaluation point, and calculation time are stored as data.

Figure 5:
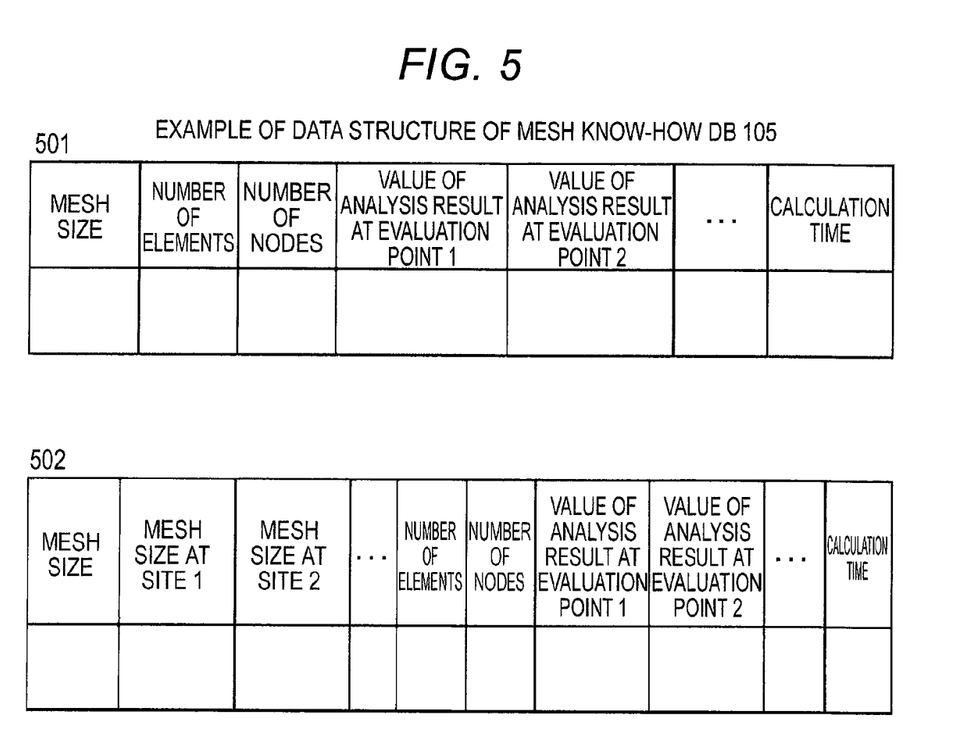
FIG. 5 shows an example of the data structure of a mesh know-how DB.

Also, when a mesh taking density and sparsity into account is generated by the multiple-mesh generating unit 103, the overall mesh size, controlled mesh size density at each site, number of elements, number of nodes, value of analysis result at each evaluation point, and calculation time are stored, as indicated by a reference numeral 502 in FIG. 5.

In accordance with the data structures indicated by the reference numerals 501 and 502, data are stored by the number of times processing is repeated at the multiple-mesh generating unit 103 and the analysis calculation unit 104.

(4) Required Accuracy/Time Limit Input Unit 107

Figure 6:
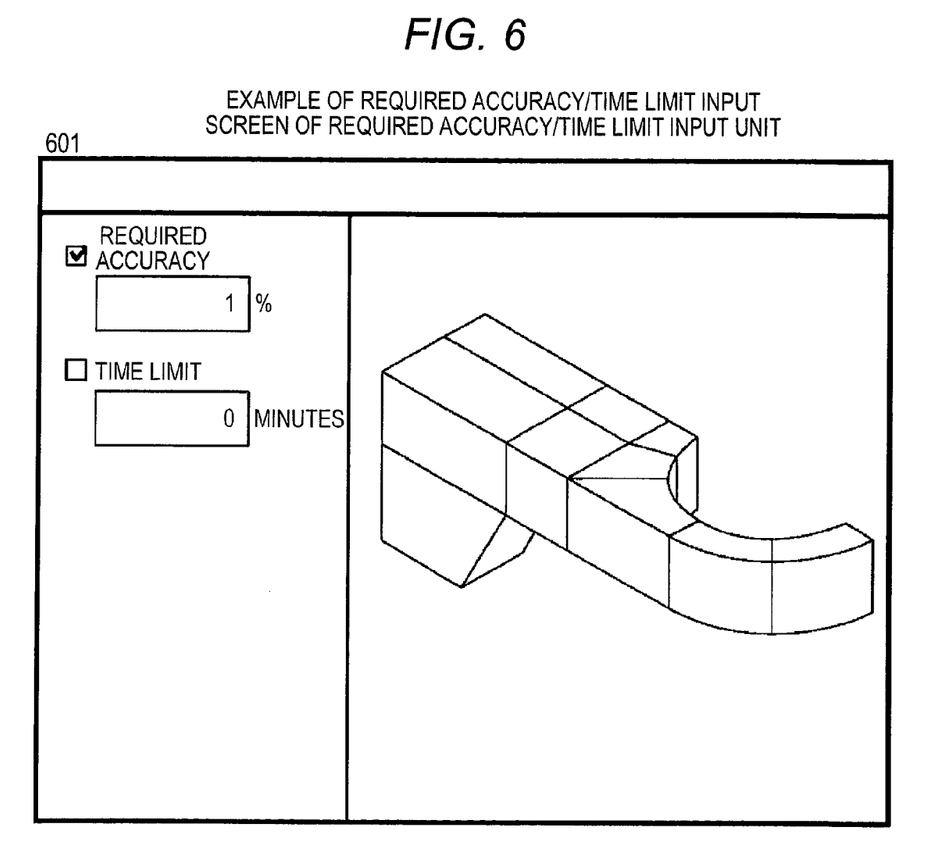
FIG. 6 shows an example of a required accuracy/time limit input screen of a required accuracy/time limit input unit.

FIG. 6 shows an example of a required accuracy/time limit input screen, as indicated by a reference numeral 601. The system user inputs one or both of required analysis accuracy and analysis calculation time limit, using the input/output device 101. At this time, if only the analysis accuracy is designated, the appropriate mesh size search unit 108 can be implemented to display an estimated calculation time. Similarly, if only the time limit is designated, estimated analysis accuracy can be displayed. On the right side of the input screen of FIG. 6, an analysis target shape is shown.

(5) Appropriate Mesh Size Search Unit 108

The appropriate mesh size search unit 108 searches for a mesh size that meets the required accuracy or calculation time limit, based on the relation among mesh size, analysis result and calculation time (cost) registered in the mesh know-how DB 105. An example of this search procedure will be described.

First, the value of the analysis result at each evaluation point with the smallest mesh size in the mesh know-how DB 105 is assumed to be the right answer ($R_i$).

Next, the value of the analysis result at each evaluation point is approximated by a function having the mesh size as a variable. Similarly, the calculation time (cost) is approximated by a function having the mesh size as a variable. In this description, it is assumed that the following functions are used for approximation.

$$V_i = |(f_i(S, S_j) - R_i)/R_i| \quad (1)$$

$$T = g(S, S_j) \quad (2)$$

$V_i$: error rate of analysis result at evaluation point i
$f_i$: approximation function of value of analysis result at evaluation point i
g: approximation function of calculation time (cost)
T: calculation time
S: overall mesh size
$S_j$: mesh size at site j Based on these function, a mesh size that meets the required accuracy or time limit designated by the required accuracy/time limit input unit 107 is calculated. When the required accuracy is designated, a range of mesh size such that the error rate $V_i$ of the analysis result at the evaluation point i is equal to or lower than a designated value with respect to all the evaluation points is found, and a mesh size which achieves the shortest calculation time T is found in this range. Similarly, when the calculation time limit is designated, a range of mesh size such that the calculation time T is equal to or less than a designated value is found, and a mesh size which achieves the lowest error rate $V_i$ of the analysis result at the evaluation point i is found in this range.

In this example, a search technique using function approximation is described. However, similar search can be made by using response surface approximation, polyhedron approximation, or piecewise linear approximation.

Finally, the analysis model setting unit 110, which sets the mesh size found by the search to the analysis model, sets the mesh size found by the search to the analysis target model. Data of the relation among mesh size, analysis result and calculation time (cost) or the like in this analysis case may be registered in the mesh know-how DB 105.

(6) Mesh Know-How Display Unit 109

Figure 7:
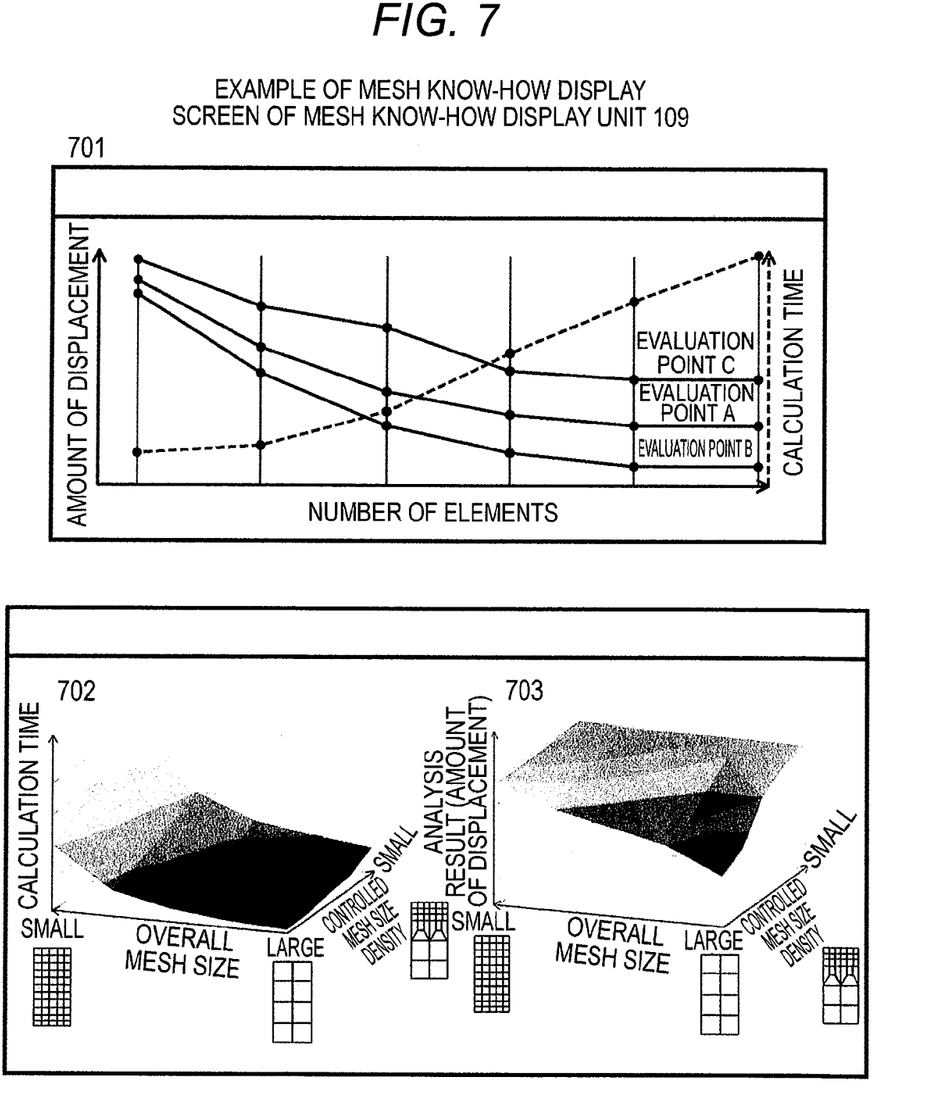
FIG. 7 shows an example of a mesh know-how display screen of a mesh know-how display unit.

The relation among mesh size, analysis result and calculation time (cost) is read from the mesh know-how DB 105 and the relation among mesh size, analysis result and calculation time (cost) is displayed.

FIG. 7 shows an example of mesh know-how display.

A reference numeral 701 indicates an example showing the relation among the number of elements, value of analysis result and calculation time in the case where the mesh size is changed uniformly at the multiple-mesh generating unit 103 and the analysis calculation unit 104, as a two-dimensional graph.

A reference numeral 702 indicates an example showing the relation between mesh size and value of analysis result in the case where a controlled mesh size density is set at one position and the overall mesh size and the controlled mesh size density are changed at the multiple-mesh generating unit 103 and the analysis calculation unit 104, as a three-dimensional graph. A reference numeral 703 indicates an example showing the relation between mesh size and calculation time in this case, as a three-dimensional graph.

As the relation among mesh size, analysis result and calculation time (cost) is thus shown, the user can learn the know-how of the mesh size designation technique.

In this example, the reference numeral 701 indicates an example in which the mesh size is changed uniformly, and the reference numerals 702 and 703 indicate an example in which a controlled mesh size density is set at one position and the overall mesh size and the controlled mesh size density are changed. If a controlled mesh size density is set at plural positions, a multi-dimensional relation is formed. In this case, a technique in which the relation is displayed after the multiple dimensions are reduced to two dimensions or three dimensions by the principal component analysis, self-organizing map, multi-dimensional scaling or the like, can be employed.

Embodiment 2

Other Examples of Configuration (1) Prediction of Calculation Time and Analysis Accuracy The user predicts calculation time and analysis accuracy from the mesh size and the mesh know-how DB.

Figure 8:
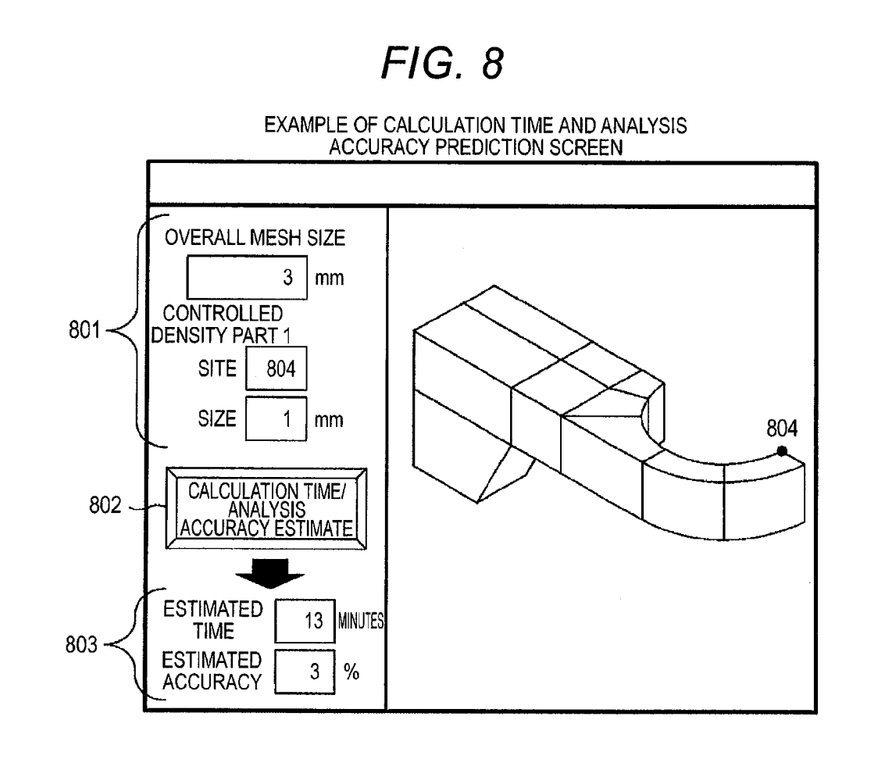
FIG. 8 shows an example of a calculation time and analysis accuracy prediction screen.

For example, the system user inputs a mesh size (in FIG. 8, this includes an overall mesh size, designation of a controlled density part 1 indicating a place where the mesh size should locally be made denser, and a denser mesh size to be achieved) into a mesh size input form 801, using a screen as shown in FIG. 8. If a calculation time/analysis accuracy estimate button 802 is pressed, the value of the analysis result and the calculation time are approximated by a function having the mesh size as a variable, following procedures similar to the processing by the appropriate mesh size search unit 108. Using the mesh size inputted in the mesh size input form 801 as a variable of this function, the calculation time and the analysis accuracy are calculated and estimate values of the calculation time and the analysis accuracy are displayed in a calculation time/analysis accuracy output form 803.

(2) Display of Analysis Accuracy Distribution

Figure 9:
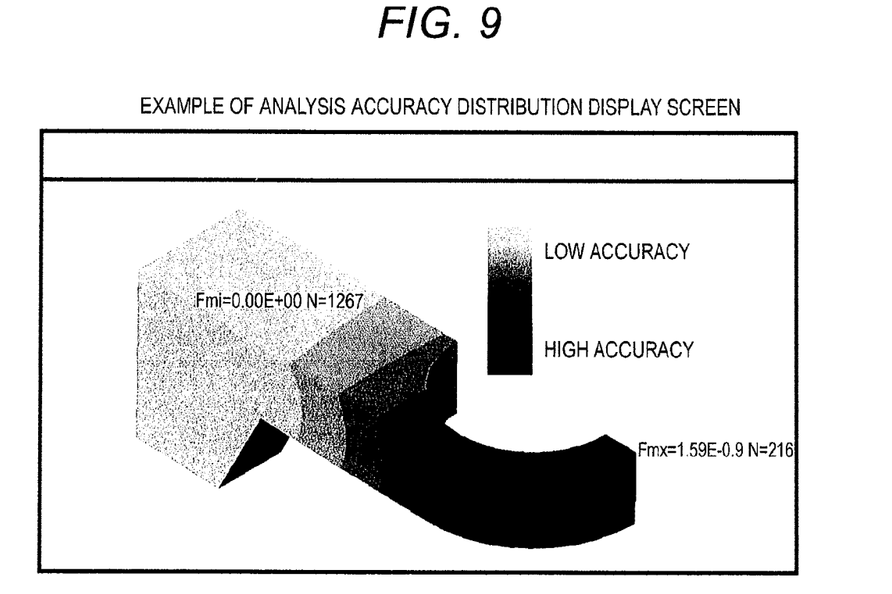
FIG. 9 shows an example of an analysis accuracy distribution display screen.

The error rate of the analysis result is calculated at all the nodes in the mesh created by the multiple-mesh generating unit 103 and the analysis calculation unit 104, following procedures similar to the processing by the appropriate mesh size search unit 108, and the calculated error rate is displayed as a distribution chart.

For example, an error distribution chart is displayed, as in the screen shown in FIG. 9. Such a distribution chart is displayed using color or black-and-white gradation showing "low accuracy" to "high accuracy", instead of using evaluation points as several representative points for analysis accuracy or statistical data such as average, deviation and maximum. Thus, it is considered that the user can determine more advanced mesh size settings.

(3) Use of Experimental Values

In the previous example, the appropriate mesh size search unit 108 assumes the value of the analysis result at each evaluation point in the smallest mesh size in the mesh know-how DB 105, as the right answer ($R_t$). In this example of configuration, an experimental value is used as the right answer ($R_t$).

Figure 10:
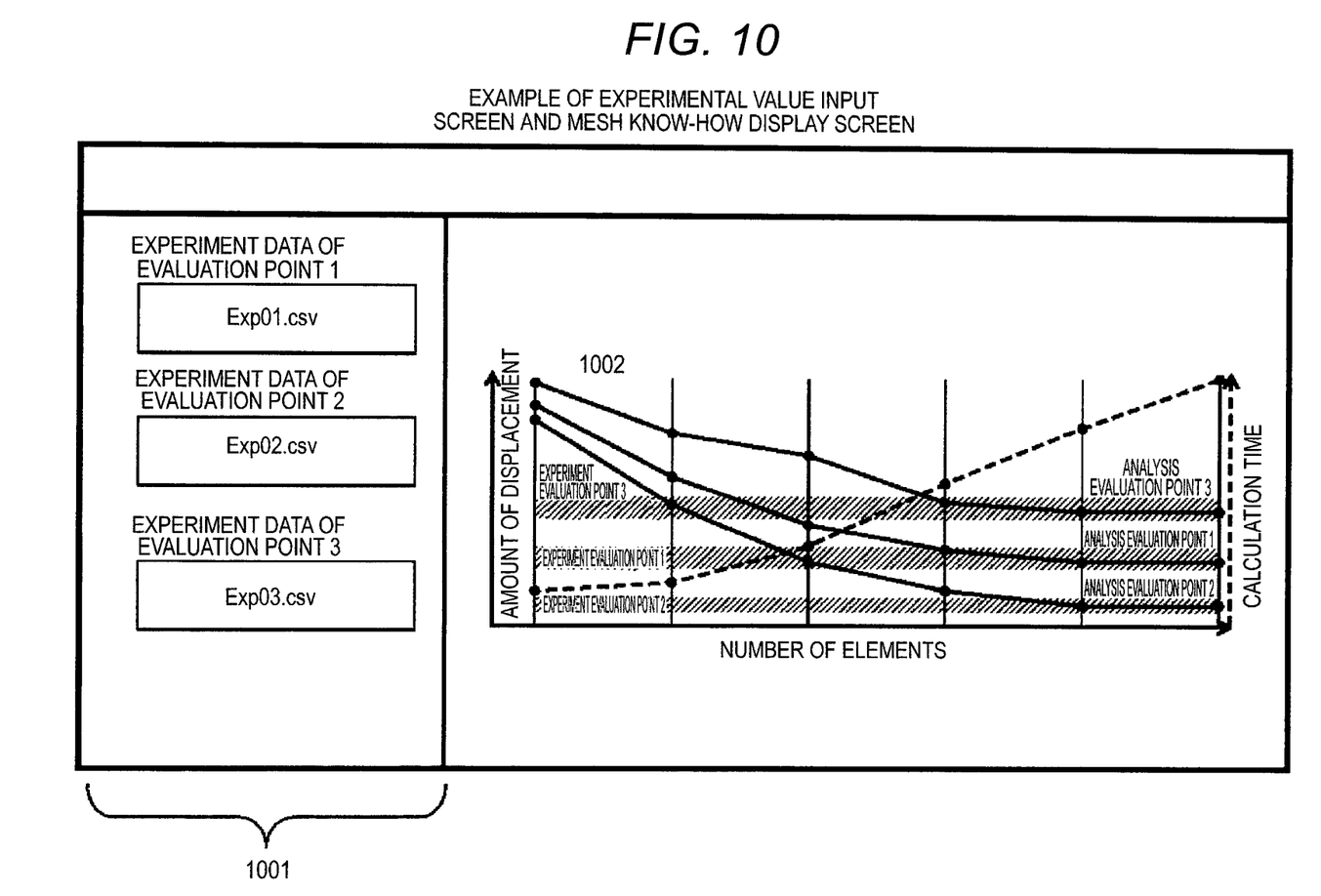
FIG. 10 shows an example of an experimental value input screen and a mesh know-how display screen.

For example, the system user designates experiment data of each evaluation point in an experiment data input form 1001, using a screen as shown in FIG. 10. After that, the appropriate mesh size search unit 108 searches for an appropriate mesh size, using the designated experiment data as the right answer ($R_t$).

Also, the mesh know-how display unit 109 can display the designated experimental values in addition to the relation among mesh size, analysis result and calculation time (cost), as indicated by a reference numeral 1002 in FIG. 10. By enabling a tolerance and variance due to the environment to be included in the experimental values, it is possible to realize a configuration in which a mesh size achieving the shortest calculation time within the range of variance of analysis result is searched for.

Embodiment 3

One Specific Example

Figure 11:
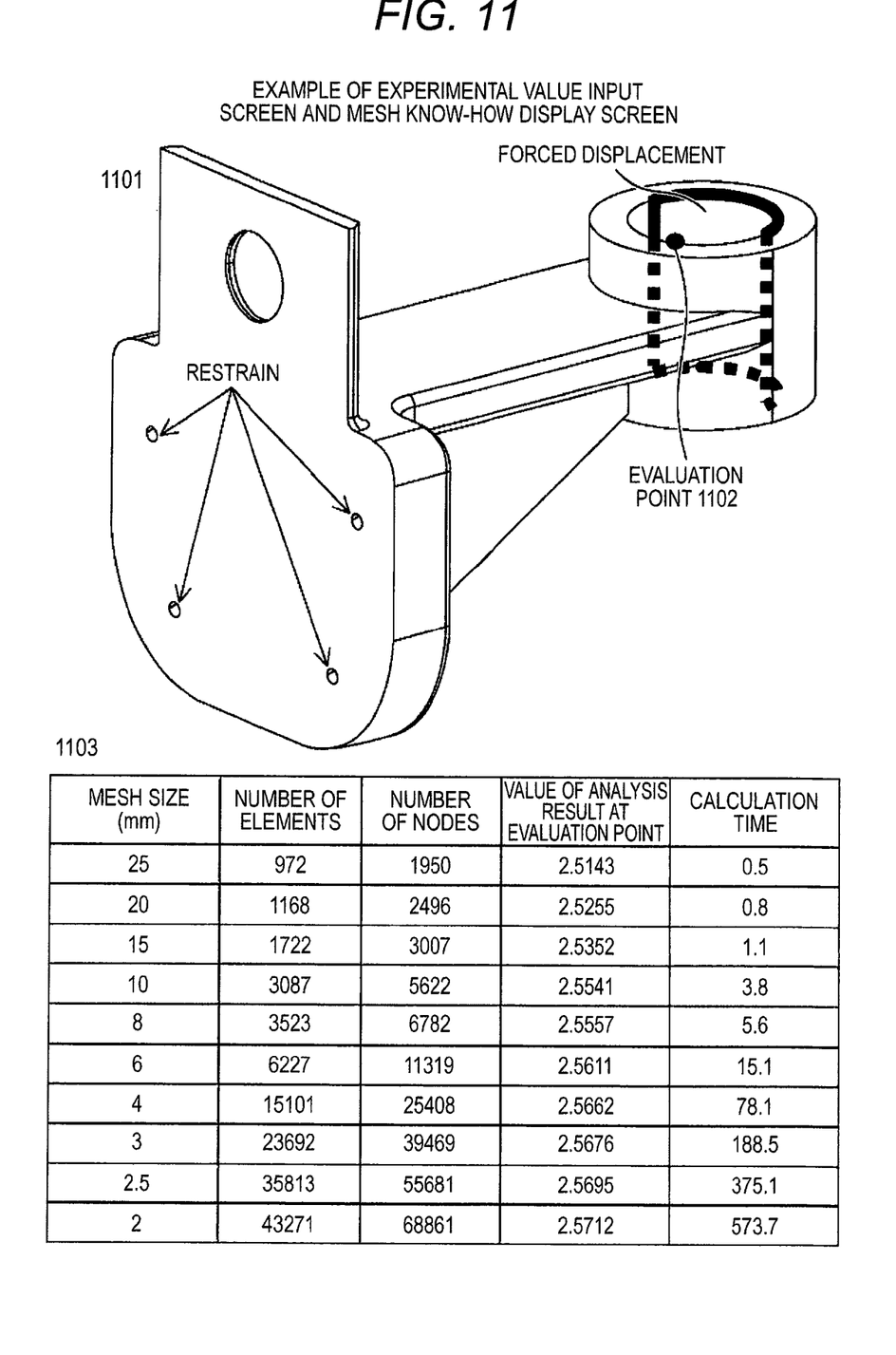
FIG. 11 shows a specific example of embodiment.

An example in which an appropriate mesh size is calculated using an analysis target shape and analysis conditions indicated by a reference numeral 1101 in FIG. 11 will be described.

First, the evaluation point designating unit 102 designates an evaluation point. In this example, it is assumed that the position indicated by a reference numeral 1102 is designated as an evaluation point.

Figure 13:
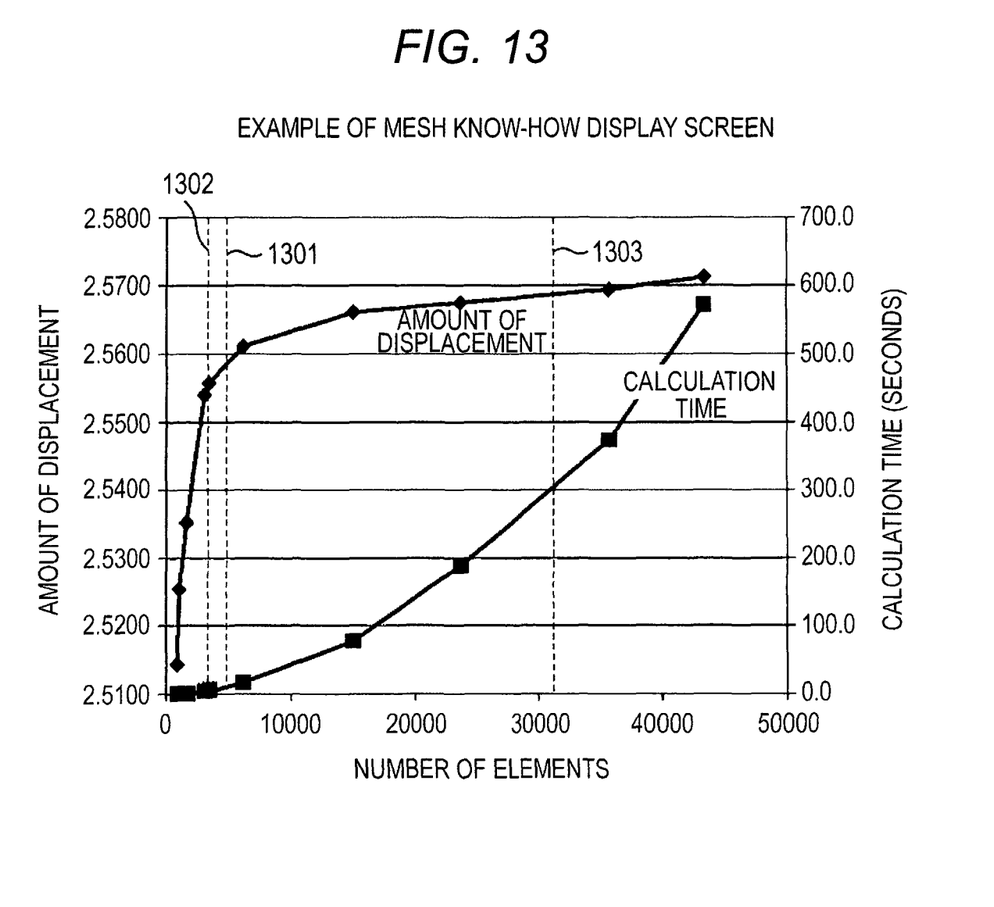
FIG. 13 shows an example of a mesh know-how display screen.

Next, the multiple-mesh generating unit 103 and the analysis calculation unit 104 carry out processing to repeat analysis calculation while reducing the mesh size. The mesh know-how DB generating unit 106 registers the result of the processing in the mesh know-how DB 105. In this example, it is assumed that values in the table indicated by a reference numeral 1103 are registered in the mesh know-how DB 105. The amount of displacement is used as the value of the analysis result. When the mesh know-how display unit 109 displays this mesh know-how DB, a graph as shown in FIG. 13 is displayed.

Next, it is assumed that the user designates 0.5% as the required accuracy at the required accuracy/time limit input unit 107.

Next, the appropriate mesh size search unit 108 searches for a mesh size which meets the required accuracy 0.5% and achieves the minimum calculation time. In this example, the mesh size with the number of elements indicated by a reference numeral 1301 in FIG. 13 is found, and the mesh size is 7 mm. At this time, the required accuracy/time limit input unit 107 displays 12 seconds as an estimated calculation time.

Figure 12:
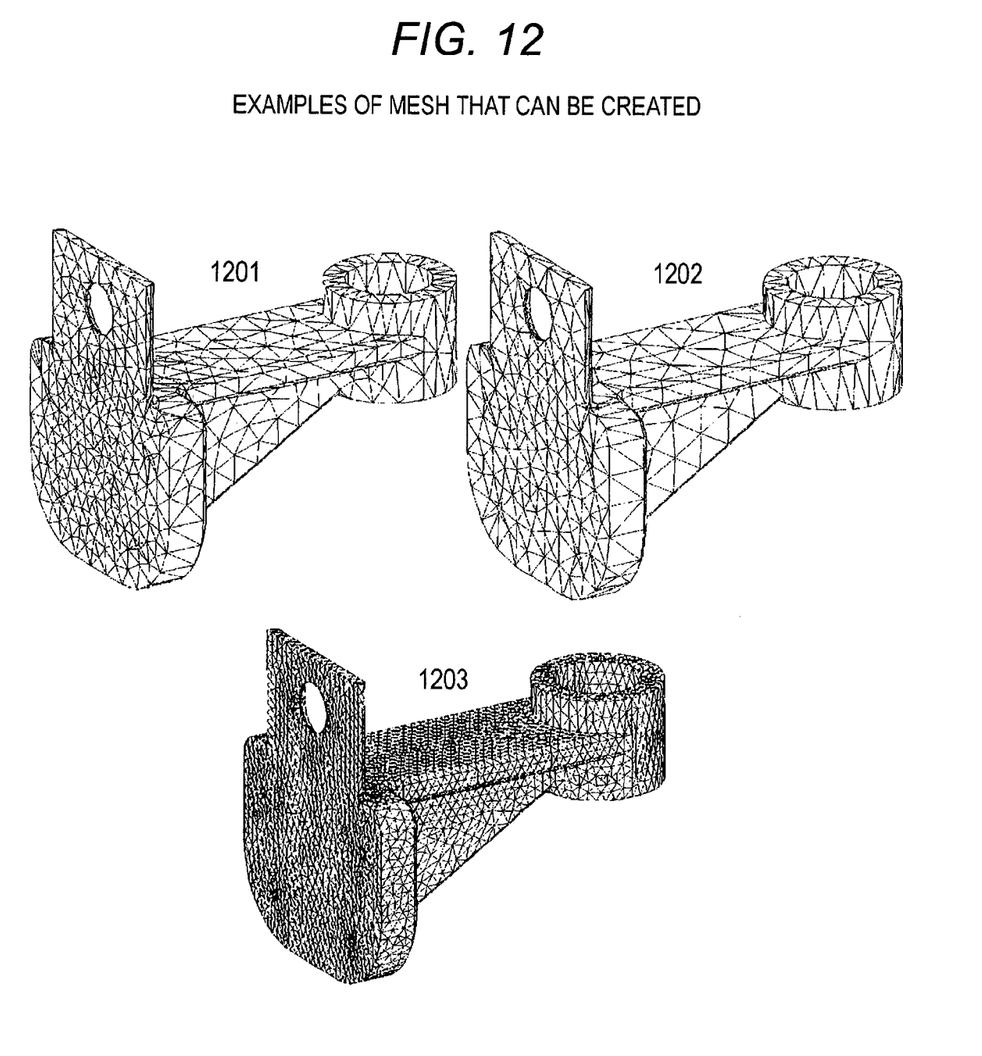
FIG. 12 shows an example of a mesh that can be created.

Consequently, the mesh indicated by a reference numeral 1201 in FIG. 12 is created. As a result of actual analysis calculation on this mesh, it is confirmed that the amount of displacement at the evaluation point is 2.5591 mm, with an error of 0.47% from the analysis result 2.5712 mm of the most dense mesh. The calculation time is 12 seconds.

Also, a case is considered where analysis needs to be carried out with multiple design parameters and a calculation time limit of five seconds is designated. Consequently, the mesh size as the number of elements indicated by a reference numeral 1302 in FIG. 13 is found and the mesh size is 8.5 mm.

The estimated analysis accuracy is shown as 0.6%. The mesh indicated by a reference numeral 1202 in FIG. 12 is created. As a result of actual analysis calculation, it is confirmed that the amount of displacement at the evaluation point is 2.5552 mm, with an error of 0.62% from the analysis result 2.5712 mm of the most dense mesh. The calculation time is 4.8 seconds.

Moreover, a case is considered where analysis with higher analysis accuracy needs to be carried out and a required accuracy of 0.1% is designated. Consequently, the mesh size as the number of elements indicated by a reference numeral 1303 in FIG. 13 is found and the mesh size is 2.7 mm. The estimated calculation time is shown as 300 seconds. The mesh indicated by a reference numeral 1203 in FIG. 12 is created. As a result of actual analysis calculation, it is confirmed that the amount of displacement at the evaluation point is 2.5689 mm, with an error of 0.09% from the analysis result 2.5712 mm of the most dense mesh. The calculation time is 302 seconds.

By thus using this system, a mesh size which achieves a minimum calculation time can automatically be decided while a required accuracy is met, or a mesh size which achieves the highest accuracy can automatically be decided while a calculation time limit is met. Thus, the burden of mesh creation can be reduced. That is, a system which automatically searches for an appropriate mesh size with high analysis accuracy can be provided.

As described above, according to the embodiments of the invention, first, a mesh generation system capable of generating a mesh model which can be analyzed with sufficient analysis accuracy for result evaluation and within a minimum possible calculation time even if the user does not grasp the tradeoff relation between analysis accuracy and analysis time due to mesh size can be provided. Second, a mesh generation system capable of carrying out mesh creation and analysis calculation at high speeds even when carrying out an analysis tens to hundreds of times in order to find out design sensitivity or for optimized calculation or the like can be provided. Third, a mesh generation system which displays the relation between analysis accuracy and calculation time due to mesh size, which the user and the organization the user belongs to can accumulate and reuse as know-how, can be provided.

The invention is not limited to the above embodiments and includes various modifications. For example, the above embodiments are described in detail in order to facilitate the understanding of the invention, and the invention is not necessarily limited to a system having all the elements of the configuration that are described. Also, a part of the configuration of one embodiment can be replaced by the configuration of another embodiment, and the configuration of one embodiment can be added to the configuration of another embodiment. Moreover, addition of another configuration, deletion and replacement can be made to a part of the configuration of each embodiment.

Furthermore, a part or the whole of each of the above configurations, functions, processing units, processing measures and the like may be realized by hardware, for example, by designing on an integrated circuit. Also, each of the above configurations, functions and the like may be realized by software as a processor interprets and executes a program which realizes each function. Information of a program, table, file and the like for realizing each function can be stored in a recording device such as memory, hard disk or SSD (solid state drive), or can be stored in a recording medium such as IC card, SD card or DVD.

Also, only control lines and information lines which are considered necessary for explanation are described, and not all the control lines and information lines of the product are necessarily described. In practice, it may be considered that almost all the elements of the configuration are interconnected.

What is claimed is:

1. A mesh generation system comprising:
one or more processors;
one or more memory devices;
a mesh know-how database generating unit stored on the one or more memory devices and executable by the one or more processors, having an evaluation point designating unit which designates an evaluation point or an evaluation site on an analysis target shape;
a multiple-mesh generating unit stored on the one or more memory devices and executable by the one or more processors, which generates a plurality of meshes of different element sizes with respect to the analysis target shape;
an analysis calculation unit stored on the one or more memory devices and executable by the one or more processors, which analyzes plural analysis model data created with the plurality of meshes of different element sizes, the mesh know-how database generating unit generating a relation among mesh element size, analysis result and calculation time;
a mesh know-how database which stores the generated relation among mesh element size, analysis result and calculation time;
an input unit stored on the one or more memory devices and executable by the one or more processors, which inputs a required accuracy or calculation time limit;
a mesh element size search unit stored on the one or more memory devices and executable by the one or more processors, which searches for a mesh element size that meets the required accuracy or calculation time limit, based on the relation among mesh element size, analysis result and calculation time registered in the mesh know-how database;
an analysis model setting unit stored on the one or more memory devices and executable by the one or more processors, which sets the mesh element size found by the search, to an analysis model; and
a display unit stored on the one or more memory devices and executable by the one or more processors, which reads the relation among mesh element size, analysis result and calculation time from the mesh know-how database and displays the relation among mesh element size, analysis result and calculation time,
wherein the mesh element size and the analysis result registered in the mesh know-how database are read, an error rate of the analysis result at each node of the mesh having the mesh element size found by the search is calculated, and the error rate is displayed as a distribution chart on the analysis target shape.

2. The mesh generation system according to claim 1, wherein a mesh element size is inputted, an estimate value of analysis accuracy and calculation time is calculated based on the inputted mesh element size and the relation among mesh element size, analysis result and calculation time registered in the mesh know-how database, and the estimate value of analysis accuracy and calculation time are displayed.

3. The mesh generation system according to claim 1, wherein experimental value data is inputted, and an analysis accuracy is calculated using the inputted experimental value data.

4. The mesh generation system according to claim 1, wherein the relation among the plurality of meshes of different element sizes, analysis result and calculation time is displayed in graphical form.

\* \* \* \* \*